United States Patent
Stolz et al.

(10) Patent No.: US 12,321,106 B2
(45) Date of Patent: *Jun. 3, 2025

(54) DEVICE FOR DETECTING A TEMPERATURE, INSTALLATION FOR PRODUCING AN OPTICAL ELEMENT AND METHOD FOR PRODUCING AN OPTICAL ELEMENT

(71) Applicant: Carl Zeiss SMT GmbH, Oberkochen (DE)

(72) Inventors: Michael Stolz, Oberkochen (DE); Timo Laufer, Stuttgart (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 79 days.

This patent is subject to a terminal disclaimer.

(21) Appl. No.: 17/950,635

(22) Filed: Sep. 22, 2022

(65) Prior Publication Data
US 2023/0018331 A1 Jan. 19, 2023

Related U.S. Application Data

(63) Continuation of application No. PCT/EP2020/086441, filed on Dec. 16, 2020.

(30) Foreign Application Priority Data

Mar. 24, 2020 (DE) ...................... 10 2020 203 750.7

(51) Int. Cl.
*G03F 7/00* (2006.01)
*G01J 5/08* (2022.01)

(52) U.S. Cl.
CPC .......... *G03F 7/7085* (2013.01); *G01J 5/0859* (2013.01); *G03F 7/70891* (2013.01); *G03F 7/70975* (2013.01)

(58) Field of Classification Search
CPC ............... G03F 7/7085; G03F 7/70175; G03F 7/70316; G03F 7/70975; G03F 1/60;
(Continued)

(56) References Cited

U.S. PATENT DOCUMENTS

| 4,298,247 A | 11/1981 | Michelet et al. |
| 5,390,228 A | 2/1995 | Niibe et al. |

(Continued)

FOREIGN PATENT DOCUMENTS

| DE | 10239859 B3 | 4/2004 |
| DE | 102005004460 A1 | 8/2006 |

(Continued)

OTHER PUBLICATIONS

English translation of DE102022200976, published Jan. 5, 2023. (Year: 2023).*

(Continued)

*Primary Examiner* — Christina A Riddle
(74) *Attorney, Agent, or Firm* — Edell, Shapiro & Finnan, LLC

(57) ABSTRACT

A device (20) for detecting a temperature on a surface (15) of an optical element (14) for semiconductor lithography. The device includes
an optical element (14) having a face (16) irradiated with electromagnetic radiation (7, 8, 43),
a temperature recording device (21), and
a temperature controlled element (22) configured to be temperature-controlled and arranged so that the predominant proportion of the intensity of the thermal radiation (25.2) detected by the temperature recording device and reflected by reflection at the surface of the optical element is emitted by the temperature-controlled element.

Also disclosed are an installation (1) for producing a surface (15) of an optical element (14) for semiconductor lithogra-
(Continued)

phy and a method for producing a surface (15) of an optical element (14) of a projection exposure apparatus (30), wherein the surface is temperature-controlled and the surface temperature is detected during the temperature control.

30 Claims, 3 Drawing Sheets

(58) Field of Classification Search
CPC .......... G03F 1/24; G03F 1/72; G03F 7/70958; G03F 7/70258; G03F 1/74; G03F 7/702; G03F 7/706; G03F 1/26; G03F 7/20; G03F 7/70008; G03F 7/70058; G03F 7/70075; G03F 7/70233; G03F 7/70266; G03F 7/70591; G03F 7/70866; G03F 7/70875; G03F 7/70883; G03F 7/70566; G03F 7/708; G03F 7/70808; G03F 7/70841; G03F 7/70858–70891; G03F 7/70908; G03F 7/70941; G03F 7/7095; G03F 7/70983; G03F 7/70991; G01J 5/0859; G01J 5/59; G01J 2005/0077; G01J 5/0007; G01J 5/061; G01J 5/53; G01J 5/485; G01J 5/0814; G01J 5/0813; G01J 5/0816; G01J 5/0853; G01J 2005/066; G01J 2005/065; G01J 5/068; G01J 5/0879; G01J 5/0896; G01J 5/54; G01J 5/532; G01J 2005/526; G01J 5/58; G01J 5/70; G01J 5/802; G01J 5/806; G01J 5/90; G01M 11/005; G21K 1/062; G21K 2201/067; G21K 1/06; G02B 5/0891; G02B 1/10; G02B 1/14; G02B 13/143; G02B 17/0663; G02B 26/0816; G02B 27/0025; G02B 27/32; G02B 27/46; G02B 27/62; G02B 5/0816; B82Y 10/00; B82Y 40/00
USPC .............................. 355/18, 30, 52–55, 67–77
See application file for complete search history.

(56) References Cited

U.S. PATENT DOCUMENTS

| | | | |
|---|---|---|---|
| 5,710,431 A | 1/1998 | Spindler | |
| 6,798,188 B2 | 9/2004 | Dathe et al. | |
| 6,821,682 B1 | 11/2004 | Stearns et al. | |
| 6,844,272 B2 | 1/2005 | Taylor et al. | |
| 6,849,859 B2 | 2/2005 | Folta et al. | |
| 6,898,011 B2 | 5/2005 | Kandaka et al. | |
| 7,083,290 B2 | 8/2006 | Masaki et al. | |
| 7,155,363 B1* | 12/2006 | Rosenthal | G01J 5/60 |
| | | | 702/135 |
| 7,189,655 B2 | 3/2007 | Takaoka | |
| 11,415,892 B2 | 8/2022 | Kaes et al. | |
| 2001/0006412 A1* | 7/2001 | Karl-Heinz | G03F 7/70891 |
| | | | 355/71 |
| 2003/0006214 A1 | 1/2003 | Stearns et al. | |
| 2003/0058986 A1 | 3/2003 | Oshino et al. | |
| 2003/0081722 A1 | 5/2003 | Kandaka et al. | |
| 2004/0061868 A1 | 4/2004 | Chapman et al. | |
| 2004/0094724 A1* | 5/2004 | Schuurmans | B82Y 10/00 |
| | | | 250/492.2 |
| 2004/0262541 A1* | 12/2004 | Honda | F25B 21/02 |
| | | | 250/492.2 |
| 2006/0234458 A1 | 10/2006 | Jennings et al. | |
| 2008/0210888 A1* | 9/2008 | Inoue | G03F 7/70291 |
| | | | 430/322 |
| 2010/0068632 A1 | 3/2010 | Motoshi et al. | |
| 2010/0171917 A1 | 6/2010 | Meltzer et al. | |
| 2010/0292950 A1* | 11/2010 | Iuchi | G01J 5/53 |
| | | | 702/134 |
| 2012/0154772 A1* | 6/2012 | Laufer | G02B 7/1815 |
| | | | 355/45 |
| 2014/0307308 A1 | 10/2014 | Weiss et al. | |
| 2016/0091798 A1 | 3/2016 | Pauls et al. | |

FOREIGN PATENT DOCUMENTS

| | | |
|---|---|---|
| DE | 102007051291 A1 | 4/2009 |
| DE | 102011084117 A1 | 4/2013 |
| DE | 102013214008 A1 | 1/2015 |
| DE | 102015224281 A1 | 9/2016 |
| DE | 102017217121 A1 | 3/2019 |
| DE | 102018211596 A1 | 1/2020 |
| DE | 102022200976 A1 * | 1/2023 |
| EP | 1521155 A2 | 4/2005 |
| JP | 2008016823 A | 1/2008 |
| WO | 2011020655 A1 | 2/2011 |

OTHER PUBLICATIONS

International Search, PCT/EP2020/086441, Apr. 13, 2021, 6 pages.
Yamada et al., "In situ Si Wafer Surface temperature Measurement during Flash Lamp Annealing", Japanese Journal of Applied Physics, Japan Society of Applied Physics, JP, vol. 49, No. 4, Apr. 20, 2010, 3 pages.
German Office Action with English translation, Application 10 2020 203 750.3, Sep. 21, 2020, 6 pages.

* cited by examiner

DEVICE FOR DETECTING A TEMPERATURE, INSTALLATION FOR PRODUCING AN OPTICAL ELEMENT AND METHOD FOR PRODUCING AN OPTICAL ELEMENT

CROSS-REFERENCE TO RELATED APPLICATIONS

This is a Continuation of International Application PCT/EP2020/086441 which has an international filing date of Dec. 16, 2020, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2020 203 750.7 filed on Mar. 24, 2020.

FIELD OF THE INVENTION

The invention relates to a device for detecting a temperature, to an installation for producing an optical element and to a method for producing an optical element.

BACKGROUND

Microlithographic projection exposure apparatuses for the extreme ultraviolet (EUV) wavelength range of 1-120 nm rely on the fact that the reflective optical elements used for imaging of a mask into an image plane have a high accuracy in relation to their surface form. Likewise, masks, as reflective optical elements for the EUV wavelength range, should have a high accuracy in relation to their surface form since the costs associated with replacing them factors significantly into the overall costs associated with operating a projection exposure apparatus.

Methods for correcting the surface form of optical elements are known, in particular, from U.S. Pat. No. 6,844,272 B2, U.S. Pat. No. 6,849,859 B2, DE 102 39 859 A1, U.S. Pat. No. 6,821,682 B1, US 2004 0061868 A1, US 2003 0006214 A1, US 2003 00081722 A1, U.S. Pat. Nos. 6,898, 011B2, 7,083,290 B2, 7,189,655 B2, US 2003 0058986 A1, DE 10 2007 051 291 A1, EP 1 521 155 A2, and U.S. Pat. No. 4,298,247.

Some of the correction methods listed in the specified documents are based on locally densifying the substrate material of optical elements by irradiation. As a result, a change in the surface form of the optical element is achieved in the vicinity of the irradiated regions. Other methods are based on direct surface ablation of the optical element. In turn, others of the aforementioned methods exploit the thermal or electrical deformability of materials in order to impress spatially extended surface form changes onto the optical elements.

DE 10 2011084117 A1 and WO 2011/020655 A1 disclose methods for protecting the reflecting optical element from long-term densification (referred to below as "compaction") of the order of a few percent by volume or from aging of the substrate material on account of EUV radiation, in addition to correcting the surface form. To this end, the surface of the reflecting optical element is homogeneously subjected to radiation, and thus densified, and/or coated with a protective layer. Both methods prevent the penetration of the EUV radiation into the substrate material. As a result, surface deformations as a result of compaction of the material by the EUV radiation, which are inadmissible in the long run, can be prevented.

A cause of compaction or aging of substrate materials, such as Zerodur® by Schott AG or ULE® by Corning Inc. having a proportion of more than 40% by volume of $SiO2$, is assumed to be the fact that, at the high production temperatures of the substrate material, a thermodynamic non-equilibrium state is frozen, which transitions into a thermodynamic ground state in the case of EUV irradiation. In line with this hypothesis, it is possible to produce coatings composed of $SiO2$ which exhibit no such compaction, since, with an appropriately chosen coating method, these layers are produced at substantially lower temperatures than the substrate material.

The compaction declines over time, as a result of which the surface form changes again. It is assumed that this decline in the compaction, which is also referred to as decompaction below, is based on a relaxation of the defect states produced in the material by the irradiation. The changes in the surface form which are caused over time by the decompaction during operation at the customer's site can be anticipated by controlling the temperature of the optical element during the manufacturing process. As a result, the decompaction which may remain and the resultant changes in the surface during operation at the customer's site are reduced to a minimum. To this end, the optical element is homogeneously or locally heated to temperatures above the normal operating temperature for a relatively long period of time, which amounts to an acceleration and, as a result, an anticipation of the decompaction which takes place over time. A drawback of the known temperature-control methods is that the temperature at the surface of the optical element, in particular a temperature profile, can be measured only indirectly. By way of example, the optical element may have cutouts from the side surfaces or, in the case of a mirror, from the rear side, temperature sensors being recessed in said cutouts. These temperature sensors detect the temperature at the end of the cutout, which lies a few mm away from the surface. A simulation of the heat flux in the optical element can be used to indirectly determine the surface temperature. This method, however, has the drawback that the temperature is measured with a time delay and makes it difficult to regulate the heating power for heating the surface.

SUMMARY

It is an object of the present invention to provide a device and a method which remedy the above-described drawbacks of the prior art. A further object of the invention is to specify an improved installation for producing an optical element.

These objects are achieved by the devices and methods specified in the independent claims. The dependent claims relate to advantageous developments and variants of the invention.

A device, according to one formulation of the invention, for detecting a temperature on a surface of an optical element for semiconductor lithography comprises an optical element having a surface irradiated with electromagnetic radiation, a temperature recording device and an element, wherein the element is configured to be temperature-controlled. According to this formulation of the invention, the element is arranged in such a way that the predominant proportion of the intensity of the thermal radiation detected by the temperature recording device and reflected by reflection at the surface of the optical element is emitted by the element.

In this case, the proportion of the intensity of the thermal radiation detected by the temperature recording device and reflected by reflection at the surface of the optical element may be more than 70%, preferably more than 80%, particularly preferably more than 90%.

What is achieved thereby is that radiation which reaches the temperature recording device and which does not originate directly from the surface—of interest for the measurement—of the optical element is emitted at least by an element whose temperature and thus whose thermal radiation can be controlled. By this measure according to the invention, the error contribution of thermal radiation reflected at the surface of the optical element can be managed more effectively than has been possible hitherto according to the prior art.

In particular, a filter, in particular a polarization filter, may be arranged upstream of the temperature recording device for the purpose of filtering disturbing radiation and for the purpose of further improving the measurement.

The thermal radiation reflected at the surface of the element is usually not polarized upon incidence on the optical element, but may be polarized in the case of reflection at the optical surface at suitable angles. The polarization filter may then be arranged in such a way that the radiation which is at least partially polarized by reflection and which is undesirable for the measurement is filtered out. This reduces the proportion of the parasitic thermal radiation of the element that reaches the temperature recording device in relation to the proportion of the thermal radiation of the surface of the optical element, such as a mirror, that is to be measured, said thermal radiation being intended to be detected for determination of the surface temperature.

In particular, the filter may be configured to be rotated about its own axis. As a result, a known frequency can be impressed on the intensity of the reflected, polarized thermal radiation, said intensity being detected by the temperature recording device. In this way, the signal portion attributed to reflected (and undesired) radiation can be easily identified and taken into account in the determination of the surface temperature of the optical element.

In a further embodiment of the invention, the surface of the optical element may comprise a coating having an emissivity for the wavelength range detected by the temperature recording device of greater than 0.05, preferably greater than 0.4, and particularly preferably of greater than 0.95. The surfaces of the optical element usually have coatings for reflecting electromagnetic radiation having a wavelength of between 1 nm and 400 nm. An additional layer, which does not reduce the reflectivity in the range of 1 nm to 400 nm and can increase the emissivity of the surface for a wavelength of 1 µm to 15 µm to the values described further above, can therefore be formed on the surface. Equally, the layer can be temporarily applied only for measurement and regulation purposes during the temperature control, that is to say can be removed again after the temperature control and prior to the use of the optical element for example in a projection exposure apparatus. Furthermore, the surface of the element may be formed in such a way that the emissivity for the wavelength range detected by the temperature recording device is less than 0.4, preferably less than 0.2, and particularly preferably less than 0.05. The element can likewise be coated, wherein a functional layer, as in the case of the optical element for semiconductor lithography, does not have to be taken into account here.

In addition, the electromagnetic radiation may comprise heating radiation for heating the surface of the optical element. This may be used, for example, for targeted heating of the surface of the optical element in the form, for example, of a mirror in order to achieve accelerated relaxation, that is to say decompaction, of the surface which is treated by irradiation and which is, as a result, compacted. This reduces the change in the surface of the mirror that still subsequently occurs over the surface life due to decompaction to a minimum.

The invention furthermore comprises an installation for producing a surface of an optical element for semiconductor lithography, comprising an optical element having a surface irradiated by electromagnetic radiation. The installation comprises a first heating device, a second heating device and a device according to one of the exemplary embodiments described further above. The electromagnetic radiation may comprise thermal radiation in a wavelength range of 800 nm to 15 µm, that is to say part of the infrared spectrum.

Furthermore, at least one heating device may comprise a light source.

In particular, the light source may be configured to provide directional electromagnetic radiation. This may be predominantly in the infrared range.

Furthermore, the light source may comprise a laser or a lamp or a light-emitting diode. The light source may also be used for both heating devices or both heating devices may also be implemented in the form of light sources, wherein the first heating device emits a constant heat output over the surface and the second heating device can locally introduce a heat output into the optical element. This may also be implemented, for example, by way of a scanning laser beam.

In addition, the installation may comprise at least one beam trap.

In particular, the beam trap may be arranged in such a way that the electromagnetic radiation reflected at the optical element is absorbed. The output absorbed in the beam trap may be discharged in a targeted manner by cooling of the beam trap, for example. As a result, any influencing of the determination of the temperature of the surface of the optical element by reflected thermal radiation, for example from an enclosure of the installation, can be effectively prevented.

Furthermore, a surface of the enclosure of the installation may be formed in such a way that the emissivity for the wavelength range detected by the temperature recording device is, at least in certain regions, less than 0.4, preferably less than 0.2, and particularly preferably less than 0.05. As a result, in addition to the beam trap, it is advantageously possible to reduce the probability that light emitted by the heating devices is detected by the temperature recording device due to single or multiple reflection.

In this case, the surface of the enclosure may be coated.

Furthermore, in another aspect, the invention according to a further formulation comprises a method for producing a surface of an optical element of a projection exposure apparatus, wherein the surface is temperature-controlled and the surface temperature is detected during the temperature control.

In this case, the surface temperature can be determined via the detection of the thermal radiation emitted by the surface.

Furthermore, the parasitic thermal radiation of an element, said parasitic thermal radiation being reflected by reflection at the surface of the optical element and being detected by the temperature detecting device, can be minimized.

In particular, the parasitic thermal radiation of the element may be minimized by controlling the temperature of the element. If the element is cooled to a very low temperature, the radiated or emitted thermal radiation is less than in the case of an element with a high temperature, as a function of the wavelength. In the case of a surface of the optical element with a temperature of 100° Celsius, it is for example possible for the element to be cooled to a temperature of −20° Celsius. As a result, the ratio of the spectral radiances of the element and of the surface of the optical element may be up to 1:500. The temperature recording device, which may for example be in the form of a thermal imaging camera, can therefore determine the surface temperature of the optical element with a high degree of accuracy.

Furthermore, the parasitic thermal radiation of the element may be minimized by an emissivity of the element of less than 0.95, preferably of less than 0.4, particularly preferably of less than 0.05. This can lead to a further reduction in the thermal radiation emitted by the element, which reduces the ratio between the spectral radiances of the element and of the surface of the optically active surface even further.

In addition, the parasitic thermal radiation of the element may be minimized by filtering of the thermal radiation detected by the temperature detecting device. It is for example possible for the dominating perpendicularly polarized proportions of the parasitic thermal radiation which is reflected at the surface of the optical element and which is thus polarized to be filtered out.

In a variant of the invention, a first heating device can be used to subject the surface to a constant heating power. The temperature distribution on the irradiated surface caused by the constant heating power is not constant on account of heat flows of differing form in the optical element in the form, for example, of a mirror. By way of example, the surface at the edge of the mirror may be cooler, since a greater heat flow is formed as a result of those side surfaces of the mirror which are in contact with the environment. Therefore, more heat is conducted away from the surface, which can lead to a lower temperature on the surface in the region of the edge.

In addition, a second heating device can be used to subject the surface to a variable heating power. According to the invention, the variable heating power can compensate for the described temperature differences on the surface of the mirror by way of targeted heating in regions with lower temperature. In this case, it is not necessary for the temperature of the entire surface of the mirror to be controlled. It is also possible for the temperature of only part of the surface to be controlled, the arrangement having to be correspondingly adapted for this.

In particular, the heating power of the first heating device and/or of the second heating device may be regulated by a controller on the basis of the detected surface temperature. As a result, the temperature of the surface can be controlled with a constant temperature with an accuracy of +/−1 K.

In a further embodiment of the invention, at least one of the heating devices may provide the heating power using directional radiation. This has the advantage that the scattering of the radiation in the installation can be reduced to a minimum and the beam trap can absorb a large part of the reflected heating radiation.

Furthermore, that region of the optical element which is not irradiated by the heating devices may be cooled. This has the advantage that temperature-sensitive components, such as the connections for manipulators for positioning and orienting the optical element or functional surfaces, are not exposed to the same temperature as at the surface of the optical element. To this end, the installation may be divided into two regions, wherein a first region can comprise the heating devices, beam traps and the device for detecting the surface temperature. The interface to the second region may run at the edge of the irradiated surface and be formed in such a way that, in the second region, environmental conditions can be set differently than in the first region.

In particular, the cooling may be effected by forced convection and be implemented, for example, by gas cooling of the second region.

BRIEF DESCRIPTION OF THE DRAWINGS

Exemplary embodiments and variants of the invention are explained in more detail below with reference to the drawing, in which.

DETAILED DESCRIPTION

Figure 1:
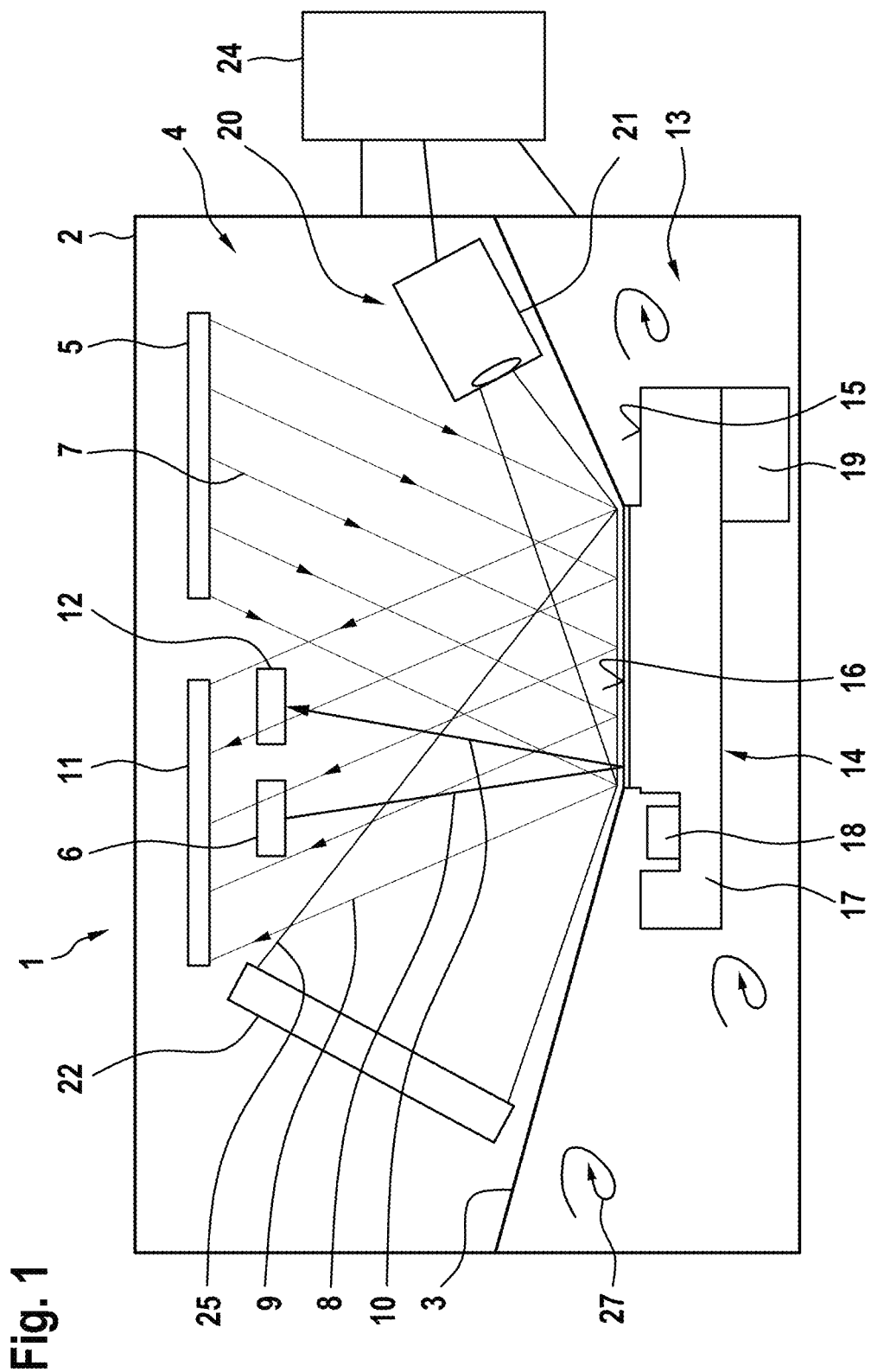
FIG. 1 shows a basic construction of an exemplary installation in which the invention can be implemented.

FIG. 1 shows an installation 1 for decompaction of optical elements for semiconductor lithography, in particular of a mirror 14, which is arranged in a housing 2 of the installation 1. The housing 2 is divided into two regions by a partition wall 3. In this case, the mirror 14 is arranged in the partition wall 3 in such a way that that part 16 of the surface 15 of the mirror 14 on which the optically active surface is formed and which is referred to below as irradiated surface 16 is arranged in the upper region of the housing 2, which is in the form of an irradiation device 4. Applications in which the partition wall 3 can be omitted are also feasible in principle.

The further components of the mirror 14, such as the main body 17 having a connection to the mechanism 18 and a functional surface 19, are arranged in the second region, which is in the form of a cooling device 13. The cooling device 13 is cooled by forced convection which is indicated by the arrows 27. The irradiation device 4 comprises a constant light source 5 in the form of an LED array which irradiates the optically active region and the environment thereof, which are intended to be decompacted, with a constant heating power by way of directional heating light 7. The front side 15 of the mirror 14 is heated by absorption, wherein, on account of the different heat flows in the mirror 14, the temperature on the irradiated surface 16 is not constant in spite of the heating power which is introduced in a constant manner. In order to compensate for the temperature differences over the irradiated surface 16, certain regions of the irradiated surface 16 are additionally irradiated in a variable manner with directional heating light 8 using a variable light source 6 in the form of a scanning laser. The two light sources 5, 6 may alternatively also be in the form of a lamp or any other light source which uses directional radiation. The constant secondary light 9 and variable secondary light 10 reflected by the mirror 14, that is to say the light which is not absorbed by the mirror, is collected in beam traps 11, 12, which are likewise arranged in the irradiation device 4. As a result, heating of the housing 2 is avoided as far as possible, which simplifies the temperature measurement of the irradiated surface 16.

By way of the constant heating light 7 and variable heating light 8, the temperature of the irradiated surface 16 can be set to be constant over the entire surface. To this end, the surface temperature of the irradiated surface 16 is determined with a device 20. This device comprises a temperature recording device in the form of an infrared camera 21, an element in the form of a background element 22 and a controller 24. The controller 24 is connected to the device 20 for determining the surface temperature, the irradiation device 4 and the cooling device 13. The background element 22 is arranged in the irradiation device 4 in such a way that the thermal radiation 25 of the background element 22 is detected by the infrared camera 21 via a reflection at the irradiated surface 16. In other words, the infrared camera 21 sees only the thermal radiation (not illustrated) emitted by the irradiated surface 16 and the thermal radiation 25 emitted by the background element 22 and reflected by the irradiated surface 16. Due to the fact that the temperature of the background element 22 is controlled, for example, to a temperature of −20° Celsius, the ratio of the thermal radiation emitted by the surface of the mirror 14 and relevant for the determination of the temperature of the irradiated surface 16 to the thermal radiation 25 emitted by the background element 22 is so great that the surface temperature of the irradiated surface can be determined with a sufficient accuracy of below ±0.5° K and optimally of below 0.1 K. This ratio can be increased further by setting the emissivities of the background element 22 and of the irradiated surface 16 for the wavelength range detected by the infrared camera 21. In this case, the emissivity for the background element 22 is reduced and that of the irradiated surface 16 is increased, which will be described below with reference to FIGS. 2, 3 and 4.

Figure 2:
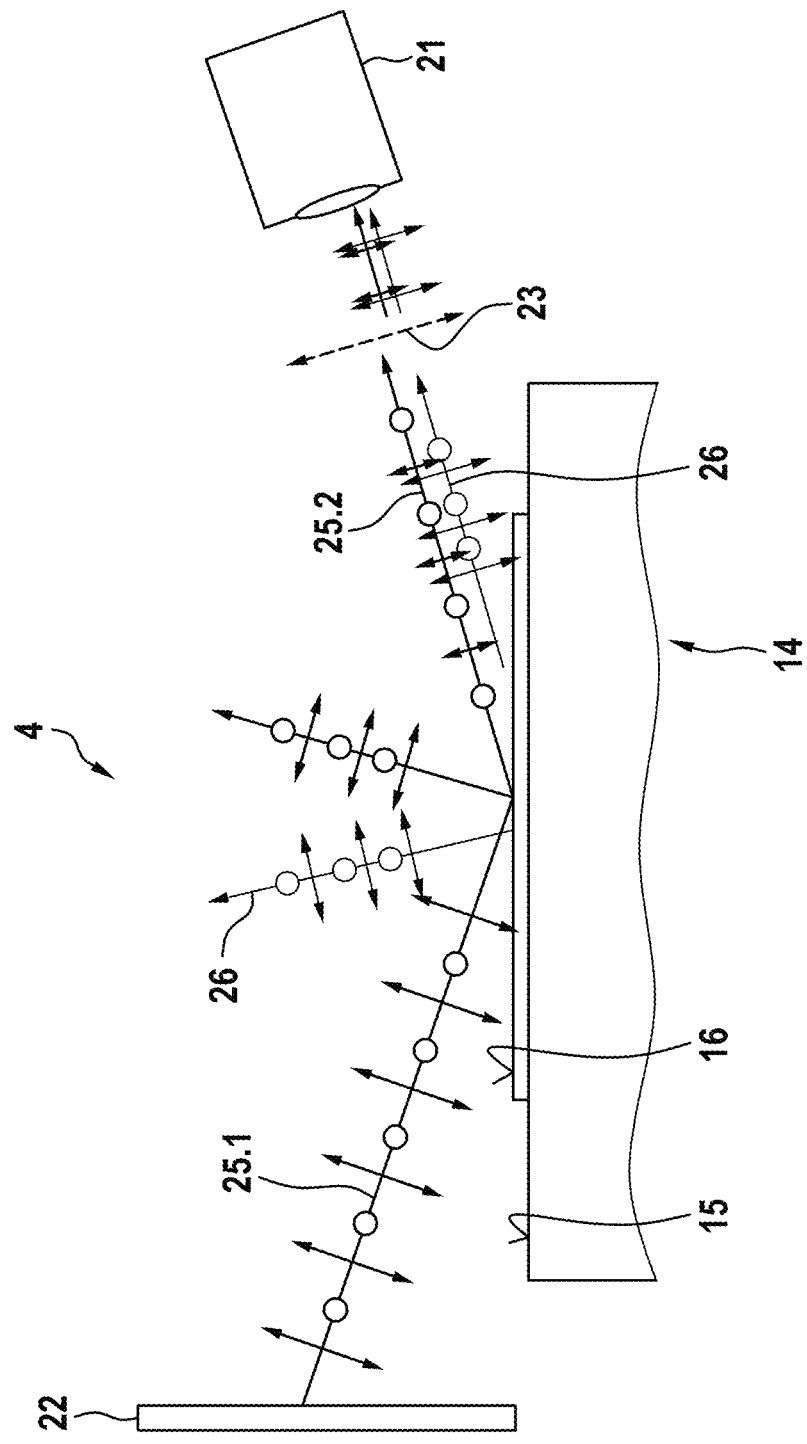
FIG. 2 shows a detail view of a device for measuring the temperature on a mirror surface.

FIG. 2 shows a device 4 for determining the surface temperature of the irradiated surface 16. The thermal radiation 25.1 emitted by the background element 22 is initially not polarized. As a result of the reflection at the irradiated surface 16 of the mirror 14, said thermal radiation is polarized primarily perpendicularly for angles of greater than 0°. The thermal radiation 25.2 arriving at the infrared camera 21, said thermal radiation being emitted by the background element 22 and reflected at the mirror, is thus oriented primarily perpendicular to the plane of incidence of the radiation on the mirror 14. This is still the case if the thermal radiation 25 is reflected at an angle of reflection close to the Brewster angle. The filter 23 arranged upstream of the infrared camera 21 blocks the perpendicular polarization direction, such that only the parallel polarization direction, that is to say the proportions of the thermal radiation 25.2 which are oriented parallel to the plane of incidence, impinge on the infrared camera 21. As a result, the ratio of thermal radiation 25.2 of the background element 22 to the thermal radiation 26 of the mirror 14, in addition to the temperature differences of the surfaces of mirror 14 and background element 22, is decreased further and the determination of the temperature of the irradiated surface 16 is additionally simplified as a result.

Figure 3:
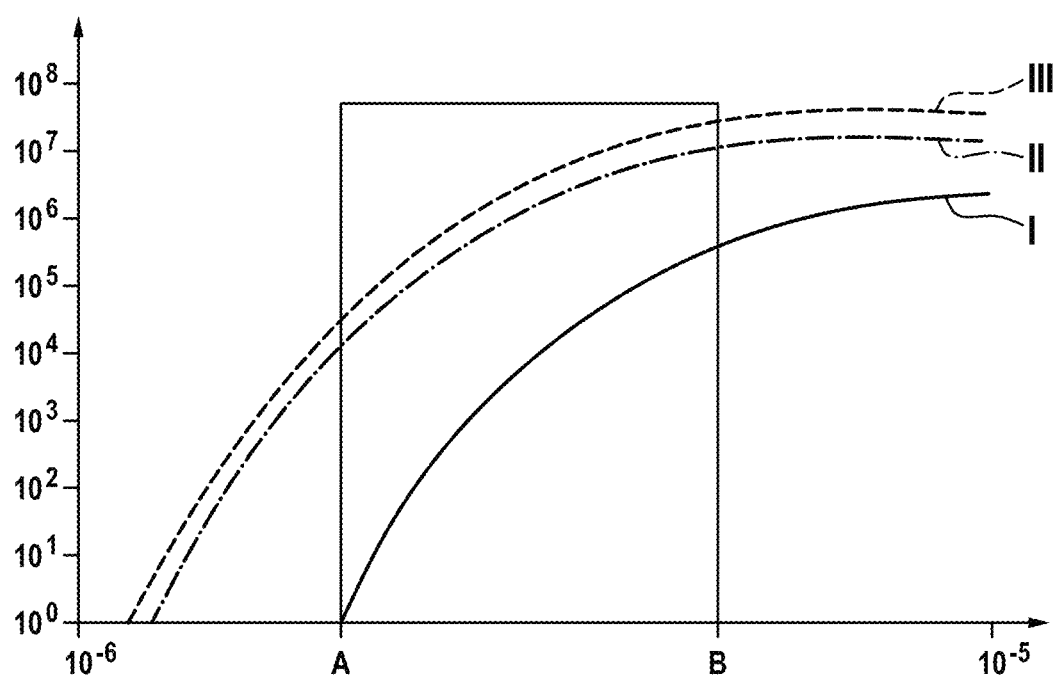
FIG. 3 shows a diagram illustrating radiances versus wavelengths.

FIG. 3 shows a diagram in which the spectral radiance in W/(m²mSr), referred to below just as radiance, is plotted against the wavelength (m) in a logarithmic plot. The wavelength is plotted on the abscissa and the radiation intensities are plotted on the ordinate. The range bounded by the points A and B on the abscissa represents the wavelength range in which the infrared camera detects thermal radiation, which range may in principle be in the range from 1 μm to 15 μm, but is between 2 μm and 5 μm in this example. Curve I shows the radiation intensity of the background element 22 temperature-controlled to −20° Celsius, said background element being illustrated in FIGS. 1 and 2. Curves II and III show the radiation intensity of the irradiated surface 16 temperature-controlled to 100° Celsius, said irradiated surface being illustrated in FIGS. 1 and 2. In this case, curve II represents the radiation intensity for an emissivity of 0.4 and curve III represents the radiation intensity for an emissivity of 1.0, that is to say for a black body.

Figure 4:
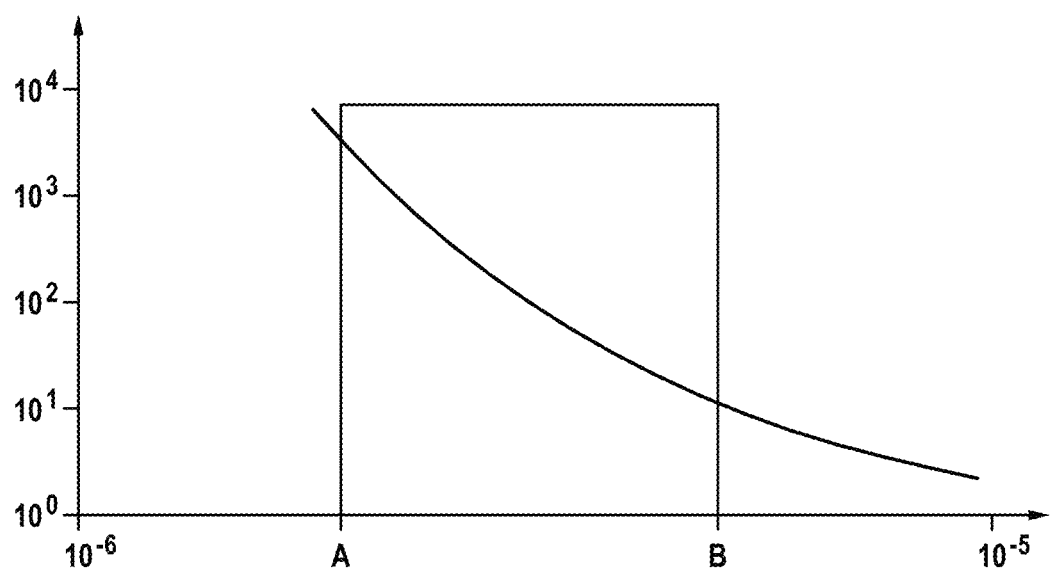
FIG. 4 shows a diagram illustrating the ratio of two radiances versus wavelength.

FIG. 4 shows a diagram in which the ratio of curves I and II illustrated in FIG. 3 is plotted likewise in a logarithmic plot. The wavelength is again plotted on the abscissa and the ratio of the radiation intensities is plotted on the ordinate. In the range of the wavelengths detected by the infrared camera, the ratio is between 12 and 1500. Even if the emissivity for the irradiated surface 16 is around values of 0.05, such as are customary in the case of non-optimized coatings, the ratio of the radiances of irradiated surface 16 and background element 22 is still more than 450, which is sufficient for determining the surface temperature of the irradiated surface with an accuracy of +/−1° K.

LIST OF REFERENCE SIGNS

1 Installation
2 Housing
3 Partition wall
4 Irradiation device
5 Constant light source
6 Variable light source
7 Constant heating light
8 Variable heating light
9 Constant reflected secondary light
10 Variable reflected secondary light
11 Beam trap for constant light
12 Beam trap for variable light
13 Cooling device
14 Mirror
15 Surface
16 Irradiated surface
17 Main body
18 Mechanism connection
19 Functional surface
20 Device
21 Infrared camera
22 Background element
23 Filter
24 Controller
25 Thermal radiation of background element
26 Thermal radiation of irradiated surface
27 Forced convection
I Radiance of background element
II Radiance of mirror epsilon=0.4
III Radiance of mirror epsilon=1
IV Radiance ratio of mirror to background element
A Lower limit of wavelength range of IR camera
B Upper limit of wavelength range of IR camera

What is claimed is:

1. A device for detecting a temperature on a surface of an optical element for semiconductor lithography, comprising:
   an optical element having a surface arranged to be irradiated with electromagnetic radiation along a first path,
   a temperature recording device configured to detect thermal radiation emitted from the optical element and thermal radiation reflected from the optical element along a second path different from the first path, and
   a temperature-controlled element emitting the thermal radiation along the second path and configured to be temperature-controlled, wherein the temperature-controlled element is controlled to be at a temperature lower than a temperature of the surface,
wherein the second path is arranged such that, of all of the thermal radiation detected by the temperature recording device, at least a predominant proportion of thermal radiation reflected at the surface of the optical element is the thermal radiation emitted by the temperature-controlled element.

2. The device as claimed in claim 1, wherein, of all of the thermal radiation reflected at the surface of the optical element and detected by the temperature recording device, at least 70% is emitted by the optical element.

3. The device as claimed in claim 1, further comprising: a filter arranged upstream of the temperature recording device.

4. The device as claimed in claim 3, wherein the filter is a polarization filter.

5. The device as claimed in claim 4, wherein the polarization filter is configured to rotate axially.

6. The device as claimed in claim 1, wherein the surface of the optical element comprises a coating having an emissivity for a wavelength range detected by the temperature recording device of greater than 0.4.

7. The device as claimed in claim 1, wherein a surface of the temperature-controlled element is formed such that an emissivity for a wavelength range detected by the temperature recording device is less than 0.4.

8. The device as claimed in claim 7, wherein the emissivity is less than 0.05.

9. The device as claimed in claim 1, wherein the electromagnetic radiation comprises heating radiation for heating the surface of the optical element.

10. An installation for producing a surface of an optical element for semiconductor lithography, comprising:
the optical element having the surface arranged to be irradiated by electromagnetic radiation,
a first heating device,
a second heating device, and
a device as claimed in claim 1.

11. The installation as claimed in claim 10, wherein the first heating device and/or the second heating device comprises a light source.

12. The installation as claimed in claim 11, wherein the light source is configured to provide directional electromagnetic radiation.

13. The installation as claimed in claim 11, wherein the light source comprises a laser or a lamp or a light-emitting diode.

14. The installation as claimed in claim 10, further comprising:
at least one beam trap.

15. The installation as claimed in claim 14, wherein the at least one beam trap is arranged such that the electromagnetic radiation reflected at the optical element is absorbed.

16. The installation as claimed in claim 10, further comprising:
an enclosure, wherein a surface of the enclosure is formed such that an emissivity for a wavelength range detected by the temperature recording device is less than 0.4.

17. The installation as claimed in claim 16, wherein the emissivity is less than 0.05.

18. The installation as claimed in claim 16, wherein the surface of the enclosure is coated.

19. A method comprising:
producing a surface of an optical element of a projection exposure apparatus, temperature-controlling the surface by irradiating the surface with electromagnetic radiation along a first path, and
detecting a surface temperature of the surface during said temperature-controlling of the surface by detecting thermal radiation emitted from the surface and thermal radiation reflected off of the surface and emitted from a temperature-controlled element along a second path, wherein the temperature-controlled element is controlled to be at a temperature lower than a temperature of the surface.

20. The method as claimed in claim 19, further comprising:
subjecting the surface of the optical element to a constant heating power with a heating device emitting the electromagnetic radiation.

21. The method as claimed in claim 20, further comprising:
subjecting the surface of the optical element to a variable heating power with a further heating device.

22. The method as claimed in claim 21, further comprising:
regulating the heating power of the heating device and/or of the further heating device with a controller based on said detecting of the surface temperature of the surface of the optical element.

23. The method as claimed in claim 21, wherein at least one of the heating devices provides the heating power using directional radiation.

24. The method as claimed in claim 20, further comprising:
regulating the heating power of the heating device and/or of a second heating device with a controller based on said detecting of the surface temperature of the surface of the optical element.

25. The method as claimed in claim 20, wherein regions of the optical element which are not irradiated by the heating device are cooled.

26. The method as claimed in claim 25, wherein the cooling is effected by forced convection.

27. A method comprising:
producing a surface of an optical element of a projection exposure apparatus, temperature-controlling the surface by irradiating the surface with electromagnetic radiation along a first path,
detecting a surface temperature of the surface during said temperature-controlling of the surface by detecting thermal radiation reflected off of the surface and thermal radiation emitted from a temperature-controlled element along a second path; and
minimizing a parasitic thermal radiation of the temperature-controlled element by controlling a temperature of the temperature-controlled element to be less than a temperature of the surface, wherein the parasitic thermal radiation is reflected at the surface of the optical element and is detected by a temperature detecting device.

28. The method as claimed in claim 27, wherein the parasitic thermal radiation of the temperature-controlled element is minimized by minimizing an emissivity of the temperature-controlled element to be less than 0.95.

29. The method as claimed in claim 28, wherein the emissivity is less than 0.05.

30. The method as claimed in claim 27, wherein the parasitic thermal radiation of the temperature-controlled element is minimized by filtering the thermal radiation of the temperature-controlled element detected by the temperature detecting device.

* * * * *